United States Patent [19]

Eby

[11] Patent Number: 4,905,262
[45] Date of Patent: Feb. 27, 1990

[54] SYNCHRONOUS PROGRAMMABLE TWO-STAGE SERIAL/PARALLEL COUNTER

[75] Inventor: David H. Eby, Aloha, Oreg.

[73] Assignee: Tektronix, Inc., Beaverton, Oreg.

[21] Appl. No.: 225,415

[22] Filed: Jul. 28, 1988

[51] Int. Cl.[4] .................... H03K 23/40; H03K 23/58
[52] U.S. Cl. ........................................ 377/44; 377/51; 377/52; 377/54
[58] Field of Search .................... 377/44, 51, 106, 54, 377/52

[56] References Cited

U.S. PATENT DOCUMENTS

| | | | |
|---|---|---|---|
| 3,849,635 | 11/1974 | Freedman | 377/44 |
| 4,160,154 | 7/1979 | Jennings | 377/44 |
| 4,499,589 | 2/1985 | Geesen | 377/44 |
| 4,519,091 | 5/1985 | Chu et al. | 377/44 |
| 4,546,487 | 10/1985 | Dackow | 377/51 |

Primary Examiner—John S. Heyman
Attorney, Agent, or Firm—Boulden G. Griffith

[57] ABSTRACT

A synchronous programmable binary counter has a parallel section and a serial section, with the length (in bits) of the serial section being the same as the modulus of the parallel section. The parallel section counts on system clocks and produces two outputs. A parallel terminal count output is produced each time the parallel section count reaches a programmed value. A frame output is generated every time the parallel section reaches its maximum count and starts counting again. The serial counter section decrements its programmed value by one each time it receives a frame signal from the parallel section. This subtraction is accomplished by a half-adder and associated borrow flip-flop. The borrow flip-flop is set by each arrival of the frame signal. Between frame signals, the decremented programmed value is circulated in a shift register as the serial subtraction process is performed. When the serial section completes its countdown, it detects the all zeros condition in its circulating shift register and sets a flip-flop indicating that it has reached its terminal count. The overall counter will complete its count and will generate a terminal count output when the parallel counter section reaches its next terminal count. The maximum count possible from this counter is S * 2^S+S, where S is the length of the serial section and the maximum count of the parallel section.

6 Claims, 2 Drawing Sheets

SYNCHRONOUS PROGRAMMABLE TWO-STAGE SERIAL/PARALLEL COUNTER

BACKGROUND OF THE INVENTION

This invention relates to the field of binary counters, and more particularly to the field of synchronous programmable two-stage hybrid counters having a parallel part and a serial part for maximum speed and efficiency.

Synchronous parallel counters are fast, but require an increasing amount of gating logic for each additional stage. This makes them too expensive and inefficient for use in very long counters.

Linear feedback shift registers (LFSR) are very fast and efficient, but complex to program, since the sequence of numbers in the count is pseudo-random and programming of an LFSR requires an initialization value which must be looked up in a table as long as the maximum count of the LFSR or calculated by an algorithm which is non-trivial.

Very long counters have therefore frequently been implemented as ripple counters. However, ripple counters cannot easily produce a terminal count indication sychronously with the signal being counted.

What is desired is a binary counter that can be made very long, that can count fast, that is easily programmable, and that is capable of producing a terminal count indication that is synchronous with the signal being counted.

SUMMARY OF THE INVENTION

The present invention provides a synchronous binary counter that can be made very long, that can operate at relatively high speeds, that is easily programmable, and that produces a terminal count indication that is synchronous with the signal being counted. This counter is a hybrid, having a parallel counter section and a serial counter section, with the parallel section output being used as input to the serial section. Both sections operate synchronously with a system clock. The length (in bits) of the serial section is the same as the modulus of the parallel section.

Both portions of the counter are supplied with programming values. Every time the count in the parallel section reaches its programmed data value, it generates a parallel terminal count signal output. And, every time the parallel section of the counter counts through its initial state, it generates a FRAME signal output. The serial counter section decrements (or increments) its programmed value by one each time it receives a FRAME signal from the parallel section. This subtraction (or addition) is accomplished by a half-adder and associated borrow (or carry) flip-flop. The borrow flip-flop is set by each arrival of a FRAME signal. Between FRAME signals, the currently stored value is circulated in a shift register as a serial subtraction process is performed.

When the serial section completes its countdown, it detects the all zeros condition in its circulating shift register and sets a flip-flop indicating that it has reached its terminal count. Then, when the parallel counter section reaches its next terminal count, the whole hybrid counter has completed its count and a terminal count signal appears at its output. The maximum count possible from this counter is $S*2^S+S$, where S is the length of the serial section and the maximum count of the parallel section.

DETAILED DESCRIPTION

Figure 1:
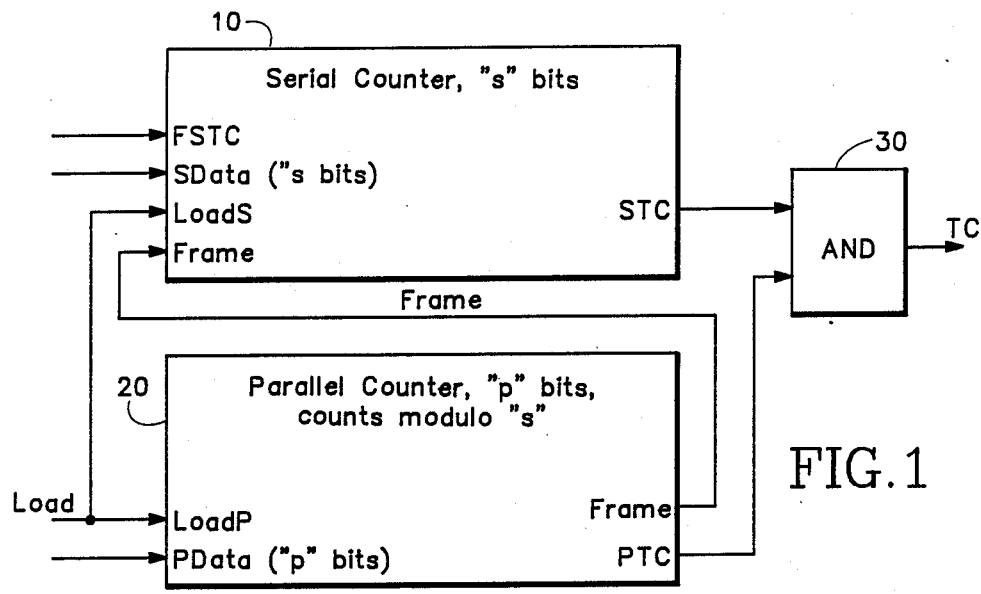
FIG. 1 is a block diagram of the synchronous programmable parallel/serial counter of the present invention.

Referring to FIG. 1, a serial counter section 10 receives as one of its inputs a FRAME signal from the output of a parallel counter section 20. An AND gate 30 produces a terminal count signal TC when its inputs are both true at the same time. One of the inputs to this AND gate 30 is the serial terminal count STC output of the serial counter section 10. The other input to this AND gate 30 is the parallel terminal count PTC output of the parallel counter section 20.

An initializing signal LOAD is an input to both counter sections 10 and 20. The serial count data signals SDATA are another input to the serial counter section 10. The parallel count data signals PDATA are another input to the parallel counter section 20. The serial counter section 10 has one additional input, the force serial terminal count signal FSTC. A system clock (not shown) provides synchronization to all of the flip-flops within both counter sections 10 and 20.

The length of the serial counter section 10 is the same as the modulus of the parallel counter section 20. Thus, every time the parallel counter section 20 produces the signal FRAME indicating that it has just counted through its all zeros condition again, the serial counter section 10 will have circulated the contents of its internal shift register by one full cycle.

At initialization, the signal LOAD resets the parallel counter section 20 to a predetermined initial state that is independent of PDATA and loads the contents of the serial count data signals SDATA into the serial counter section 10. This signal LOAD is synchronous with the system clock (not shown). The serial counter section 10 contains a shift register, zero detection logic, and a half-adder connected to subtract a least significant bit from the contents of the shift register every time the value stored in the shift register circulates. Obviously, an alternative version of this circuit could be based on addition instead of subtraction, in which case the SLOAD value would have to be the complement of the value required for the subtracting version.

Because the length of the serial counter section 10 is equal to the modulus of the parallel counter section 20, the contents of the serial section will have the right amount of time to circulate around the circular shift register once for every FRAME pulse from the parallel counter section. The serial counter section 10 can be configured to count up or down from the value initially loaded by the LOAD signal on every FRAME pulse from the parallel section. Either way, it will eventually reach a zero count and produce the serial terminal count signal STC.

The parallel counter section 20 receives the parallel count data PDATA. PDATA specifies the state within the parallel counter's count sequence during which it asserts the parallel count signal PTC. The PTC signal occurs for one state during each pass of the parallel counter through its count sequence. The parallel counter also generates the FRAME signal during a state of the parallel count sequence that is independent of PDATA. FRAME will typically be generated during the first or last state of the parallel count sequence, but either way it will be synchronized with a known state of the serial section. This is because both sections are initialized to known relative states by the LOAD signal.

The circulation within the serial counter section is synchronized to the FRAME signal, counting down once for each time it occurs. Thus, when the parallel counter section has reached its full count a number of times equal to the initialization value of the serial section, that section produces its terminal count, STC. The active state of STC enables one side of the AND gate 30. The next time that the count of the parallel counter coincides with the value of the parallel count data PDATA, another parallel terminal count signal PTC occurs, and the output of the AND gate 30, the terminal count TC signal, goes active, indicating that the overall counter has reached its terminal count.

Figure 2:
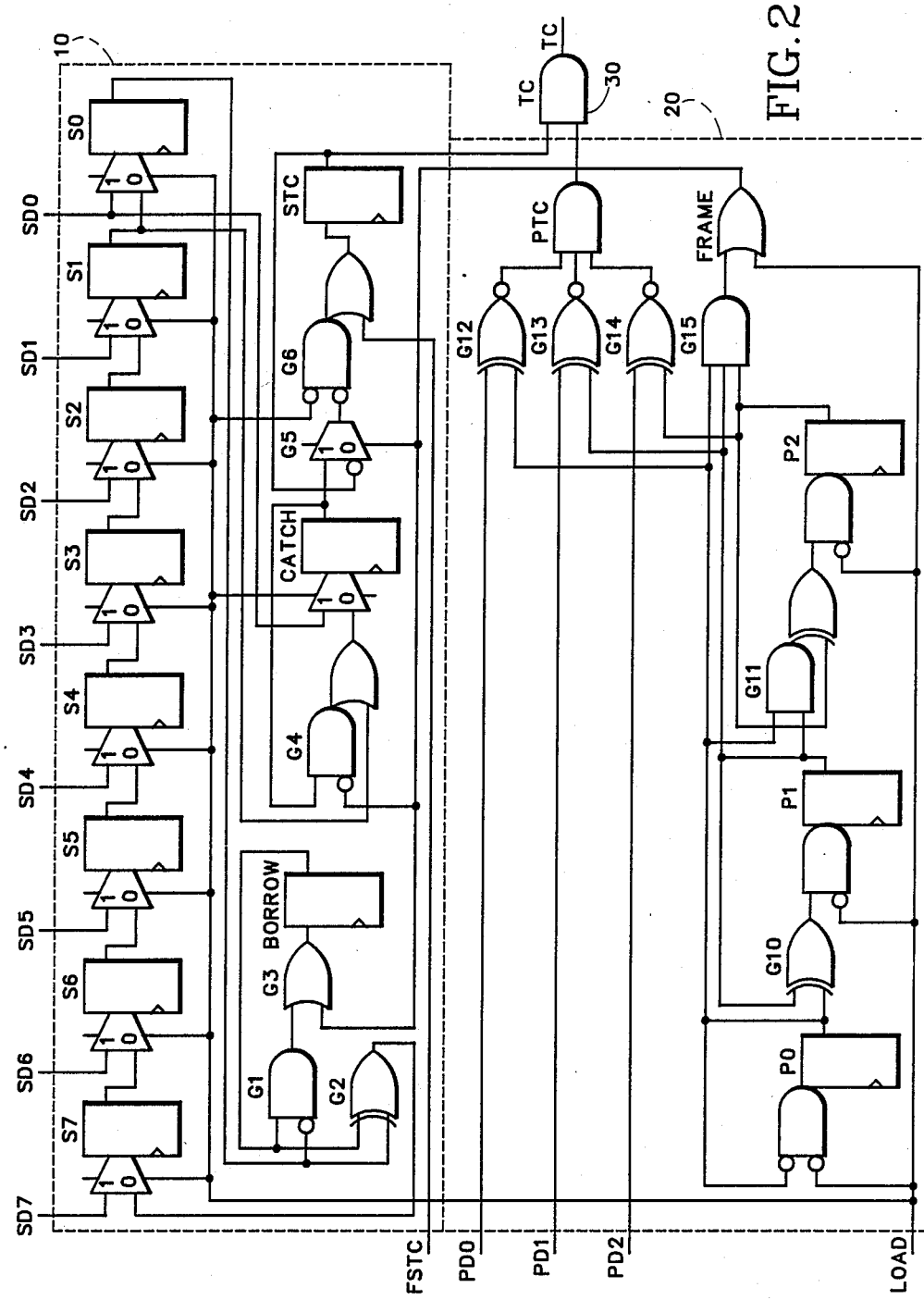
FIG. 2 is a schematic diagram of one embodiment of the synchronous programmable parallel/serial counter of the present invention.

Referring now to FIG. 2, a simplified version of the invention is shown for clarity. A full-size, practical version of this counter has a 32-bit serial section and a 5-bit parallel section ($2^5=32$), for a maximum count capacity of $32*2^{32}+32$, or approximately $137 \times 10^9$. However, for ease of discussion, the example shown in the schematic of FIG. 2 has been truncated to contain an 8-bit serial section and a 3-bit parallel section ($2^3=8$), giving it the limited total count capacity of $8*2^8+8$, or 2056. Note that the number (eight) of flip-flops S0–S7 in the counter proper portion of the serial counter section 10 is equal to the modulus of the parallel counter section 20. This number will be referred to later as the value of "S".

The parallel counter section 20 in FIG. 2 can be seen to comprise three flip-flops P0–P2. These three flip-flops P0–P2 are the counter proper. All of their outputs are connected to AND gate G15 which is one source of input to the OR gate FRAME. The FRAME signal is therefore produced by a full count of the parallel counter section. LOAD also produces a FRAME signal through that OR gate FRAME. The parallel counter section 20 also contains XOR gates G12–G14 and AND gate PTC, which cooperate to detect the parallel terminal count condition supplied by parallel data lines PD0–PD2.

Continuing to refer to FIG. 2, the serial counter section 10 can be seen to comprise eleven flip-flops S0–S7, BORROW, CATCH, and STC. The first eight of these flip-flops S0–S7 are the shift register. This shift register S0–S7 receives a value to be counted down from at initialization time and circulates decrementing intermediate data values as the count is decremented. Because this shift register is as long as the maximum count of the parallel counter section 20, the contents of this shift register circulate and are decremented once during each complete count of the parallel counter section 20.

As the contents of the shift register S0–S7 circulate, the contents of flip-flop S1 are monitored by gate G4. If any of the bits in the value being circulated are a "1", the flip-flop CATCH is set, indicating that the present value in the shift register S0–S7 is non-zero. Each FRAME signal from the parallel counter section 20 resets this flip-flop CATCH if it is set. After the contents of the shift register has been decremented to all zeros, the flip-flop CATCH will not be set at the end of that circulation cycle and its low output will set the serial terminal count flip-flop STC through the MUX G5 when the next FRAME signal activates that path.

AND gate G1 and XOR gate G2 are a half-adder. They are connected to the BORROW flip-flop as a subtractor. When a FRAME signal is generated by the parallel counter section 20, the borrow flip-flop BORROW is set through OR gate G3.

If the flip-flip S0 contains a "1", XOR gate G2 will pass a "0" to flip-flop S7 on the next clock. The "1" from S0 will be inverted and therefore will disable G1 causing the BORROW flip-flop to reset on that (same) clock.

If, on the other hand, the flip-flop S0 contains a zero, the BORROW flip-flop will remain set and a "1" will be passed on to flip-flop S7 by XOR gate G2. This outcome will be repeated each time another consecutive "0" appears in flip-flop S0. The first time a "1" appears in flip-flop S0, it will be replaced by a "0" in flip-flop S7 and the BORROW flip-flop will then be reset, completing the borrowing process.

The initializing signal LOAD is an input to both the parallel counter section 20 and the serial counter section 10. Within the parallel counter section 20, the LOAD signal is connected to the low-input AND gates on the inputs of each flip-flop P0–P2, so that on the next clock after LOAD goes high all of the flip-flops in the parallel section are reset to "000". (On this same clock edge, LOAD goes low.) The LOAD signal also generates a FRAME signal through the OR gate FRAME.

Within the serial counter section 10, the initializing signal LOAD switches all of the input MUXes on the counter flip-flops S0–S7 to their data input positions, so that the data on SD0–SD7 is loaded into the flip-flops S0–S7. The LOAD signal also loads the SD0 data into the CATCH flip-flop, as part of the initialization process.

When the total number to be counted is less than or equal to the capacity of the parallel counter section, the force serial terminal count signal FSTC is used to bypass the serial counter section 10. For these short counts, the force serial terminal count signal FSTC places the serial counter section 10 Serial Terminal Count flip-flop STC in a set condition, thus enabling the AND gate TC and causing the terminal count signal TC to go true as soon as the parallel terminal count signal PTC next does so. The value to be counted to is then determined entirely by the data applied to the parallel terminal count recognition gates G12–G14 by the parallel data signals PD0–PD2, and all of the S0–S7 data is "don't care".

In general, to program the overall counter, the number to be counted to is first decremented by one, then divided by "S", which we have defined as the length in bits of the serial section and the maximum count of the parallel section. The whole number quotient minus one is the value to be applied to the serial data lines S0–SX. If the quotient is zero, FSTC is asserted and the serial data is "don't care". The remainder is the value to be applied to the parallel data lines.

Let us trace the operation of the invention using an example. Assume that we want to count the decimal 34. We subtract 34, yielding 33, then divide 33 by 8, the "S" value of the circuit in FIG. 2. The quotient is four, with a remainder of one. Therefore, the serial load data is a "three"; that is four minus one. So, SD0=1 and SD1=1, and all of the other serial data=0. The parallel load data will be the remainder of "one". Therefore, P0=1, P1=0, and P2=0.

With these values loaded, the overall counter will count up to a decimal value of "34", or $4*8+2$. The serial counter section will have to cycle around a total of four times; three times to subtract out the three that it was loaded with and one additional time to detect the all zeros condition and set the Serial Terminal Count flip-flop STC. Note that the parallel data PD0-PD2 doesn't actually get loaded into the parallel flip-flops P0-P2 the way that the serial data SD0-SD7 gets loaded into the serial flip-flops S0-S7. Instead, the LOAD signal puts the parallel counter section flip-flops P0-P2 in an all 0's state, and it counts up to match the applied data values.

The following example shows the counter of the present invention in action, counting to a decimal value of thirty-four per the example above. (The missing line after every eight lines of activity is only a visual aid for humans, indicating that both counters have each completed one cycle of activity. In reality, the counter runs continuously through these apparent pauses.)

flip-flop to reset. On this same clock, the parallel section increments to "001". That value in the parallel section produces a parallel terminal count PTC indication, but AND gate TC is disabled by a low from the serial count flip-flop STC.

From lines 3 to 7, the parallel section is counting and the serial section is shifting. At line 8, the full count of the parallel section produces a FRAME signal. At line 9, the FRAME signal from the previous line has now caused BORROW to set and CATCH to reset. The "1" which has been shifting has now reached its reference location in the serial counter and the counter can now be seen to have concluded its decrement to "00000010".

At line 10, the CATCH flip-flop has been set again by the "1" in S1 on the preceeding clock, line 9. S7 is set by the absence of a "1" in S0 in combination with the presence of a "1" in the BORROW flip-flop, as determined by XOR gate G2. The low from S0 also enables AND

TABLE 1

| | P0 | P1 | P2 | PR | PTC | S0 | S1 | S2 | S3 | S4 | S5 | S6 | S7 | BOR | CAT | STC | TC |
|---|---|---|---|---|---|---|---|---|---|---|---|---|---|---|---|---|---|
| | | | | | | COUNTING TO 34 | | | | | | | | | | | |
| 1 | 0 | 0 | 0 | 0 | 0 | 1 | 1 | 0 | 0 | 0 | 0 | 0 | 0 | 1 | 1 | 0 | 0 |
| 2 | 1 | 0 | 0 | 0 | 1 | 1 | 0 | 0 | 0 | 0 | 0 | 0 | 0 | 1 | 0 | 0 | 0 |
| 3 | 0 | 1 | 0 | 0 | 0 | 0 | 0 | 0 | 0 | 0 | 0 | 0 | 1 | 0 | 1 | 0 | 0 |
| 4 | 1 | 1 | 0 | 0 | 0 | 0 | 0 | 0 | 0 | 0 | 0 | 1 | 0 | 0 | 1 | 0 | 0 |
| 5 | 0 | 0 | 1 | 0 | 0 | 0 | 0 | 0 | 0 | 0 | 1 | 0 | 0 | 0 | 1 | 0 | 0 |
| 6 | 1 | 0 | 1 | 0 | 0 | 0 | 0 | 0 | 0 | 1 | 0 | 0 | 0 | 0 | 1 | 0 | 0 |
| 7 | 0 | 1 | 1 | 0 | 0 | 0 | 0 | 0 | 1 | 0 | 0 | 0 | 0 | 0 | 1 | 0 | 0 |
| 8 | 1 | 1 | 1 | 1 | 0 | 0 | 0 | 1 | 0 | 0 | 0 | 0 | 0 | 0 | 1 | 0 | 0 |
| 9 | 0 | 0 | 0 | 0 | 0 | 0 | 1 | 0 | 0 | 0 | 0 | 0 | 0 | 1 | 0 | 0 | 0 |
| 10 | 1 | 0 | 0 | 0 | 1 | 1 | 0 | 0 | 0 | 0 | 0 | 0 | 1 | 1 | 1 | 0 | 0 |
| 11 | 0 | 1 | 0 | 0 | 0 | 0 | 0 | 0 | 0 | 0 | 0 | 1 | 0 | 0 | 1 | 0 | 0 |
| 12 | 1 | 1 | 0 | 0 | 0 | 0 | 0 | 0 | 0 | 0 | 1 | 0 | 0 | 0 | 1 | 0 | 0 |
| 13 | 0 | 0 | 1 | 0 | 0 | 0 | 0 | 0 | 0 | 1 | 0 | 0 | 0 | 0 | 1 | 0 | 0 |
| 14 | 1 | 0 | 1 | 0 | 0 | 0 | 0 | 0 | 1 | 0 | 0 | 0 | 0 | 0 | 1 | 0 | 0 |
| 15 | 0 | 1 | 1 | 0 | 0 | 0 | 0 | 1 | 0 | 0 | 0 | 0 | 0 | 0 | 1 | 0 | 0 |
| 16 | 1 | 1 | 1 | 1 | 0 | 0 | 1 | 0 | 0 | 0 | 0 | 0 | 0 | 0 | 1 | 0 | 0 |
| 17 | 0 | 0 | 0 | 0 | 0 | 1 | 0 | 0 | 0 | 0 | 0 | 0 | 0 | 1 | 1 | 0 | 0 |
| 18 | 1 | 0 | 0 | 0 | 1 | 0 | 0 | 0 | 0 | 0 | 0 | 0 | 0 | 1 | 0 | 0 | 0 |
| 19 | 0 | 1 | 0 | 0 | 0 | 0 | 0 | 0 | 0 | 0 | 0 | 0 | 0 | 1 | 0 | 0 | 0 |
| 20 | 1 | 1 | 0 | 0 | 0 | 0 | 0 | 0 | 0 | 0 | 0 | 0 | 0 | 1 | 0 | 0 | 0 |
| 21 | 0 | 0 | 1 | 0 | 0 | 0 | 0 | 0 | 0 | 0 | 0 | 0 | 0 | 1 | 0 | 0 | 0 |
| 22 | 1 | 0 | 1 | 0 | 0 | 0 | 0 | 0 | 0 | 0 | 0 | 0 | 0 | 1 | 0 | 0 | 0 |
| 23 | 0 | 1 | 1 | 0 | 0 | 0 | 0 | 0 | 0 | 0 | 0 | 0 | 0 | 1 | 0 | 0 | 0 |
| 24 | 1 | 1 | 1 | 1 | 0 | 0 | 0 | 0 | 0 | 0 | 0 | 0 | 0 | 1 | 0 | 0 | 0 |
| 25 | 0 | 0 | 0 | 0 | 0 | 0 | 0 | 0 | 0 | 0 | 0 | 0 | 1 | 0 | 0 | 0 | 0 |
| 26 | 1 | 0 | 0 | 0 | 1 | 0 | 0 | 0 | 0 | 0 | 0 | 1 | 1 | 0 | 0 | 0 | 0 |
| 27 | 0 | 1 | 0 | 0 | 0 | 0 | 0 | 0 | 0 | 0 | 1 | 1 | 1 | 0 | 0 | 0 | 0 |
| 28 | 1 | 1 | 0 | 0 | 0 | 0 | 0 | 0 | 0 | 1 | 1 | 1 | 1 | 0 | 0 | 0 | 0 |
| 29 | 0 | 0 | 1 | 0 | 0 | 0 | 0 | 0 | 1 | 1 | 1 | 1 | 1 | 0 | 0 | 0 | 0 |
| 30 | 1 | 0 | 1 | 0 | 0 | 0 | 0 | 1 | 1 | 1 | 1 | 1 | 1 | 0 | 0 | 0 | 0 |
| 31 | 0 | 1 | 1 | 0 | 0 | 0 | 1 | 1 | 1 | 1 | 1 | 1 | 1 | 0 | 0 | 0 | 0 |
| 32 | 1 | 1 | 1 | 1 | 0 | 1 | 1 | 1 | 1 | 1 | 1 | 1 | 1 | 0 | 0 | 0 | 0 |
| 33 | 0 | 0 | 0 | 0 | 0 | 1 | 1 | 1 | 1 | 1 | 1 | 1 | 1 | 1 | 1 | 0 | 0 |
| 34 | 1 | 0 | 0 | 0 | 1 | 1 | 1 | 1 | 1 | 1 | 1 | 1 | 0 | 0 | 1 | 1 | 1 |

Line 1 of Table 1 shows the state of the counter following initialization for the example of counting to decimal "34". The serial section has been loaded with the data value of "00000011". The parallel section has been set to all zeros, "000". The parallel data lines are waiting to recognize a "001", on the next clock. The CATCH flip-flop has been set by the SD0 value of "1". The BORROW flip-flip has been set by the FRAME signal generated by the LOAD signal through the OR gate FRAME. A high LOAD signal also disabled low-input AND gate G6, causing the serial terminal count flip-flop STC to be reset.

After another clock, at line 2 of Table 1, the "1" in the S1 flip-flop circulates to the S0 position and the "1" in S0, in combination with the feedback from the BORROW flip-flop, causes a "0" to be put in S7 through XOR gate G2. The "1" from the S0 flip-flop also disables low-input AND gate G1, causing the BORROW gate G1 because that input to that gate is inverted, keeping the BORROW flip-flop set. The "1" in S1 moves to S0.

At line 11, the "1" in S0 during the last state now disables AND gate G1 and the BORROW flip-flop is reset. The "1" from S0 last time, in conjunction with the BORROW flip-flop having been set, causes a "0" to be put in S7. This completes this borrowing operation, and the one remaining "1" is now going to be in S0, the LSB, when the serial counter reaches its reference condition at line 17.

At line 17, the BORROW bit has just been set. But this time, the presence of a "1" in S1 keeps CATCH set. On the next clock the S0 bit and the BORROW bit will annihilate each other due to the operation of the half-subtractor gates, G1 and G2, and the only remaining activity in the rest of this cycle is the counting of the parallel section which produces a FRAME signal at line 16.

At line 25, the FRAME signal on the preceeding line has now caused BORROW to set and CATCH to reset again. During this cycle the absence of a "1" in S1 will prevent the CATCH bit from being set until line 33 at the beginning of the last (partial) cycle. During this cycle, the set BORROW bit and the absence of anything to borrow from causes S7 to be repeatedly set, filling up the serial counter with "1"s as the register shifts.

At line 33, the serial terminal count flip-flop STC sets due to the absence of a "1" in the CATCH flip-flop at the time of the FRAME signal. When FRAME is high, the MUX G5 passes the "0" from the CATCH flip-flop through to low-input AND gate G6 whose other side is enabled by the low on LOAD. With STC set, one side of the terminal count AND gate TC is enabled. On the next count, line 34, the parallel terminal count signal PTC goes true, generating the desired TC output.

Table 2 shows an example of the invention counting to 5, a number less than the maximum count of the parallel section, and thus one that requires the use of the Force Serial Terminal Count FSTC signal to set the STC flip-flop as part of the initialization process. With STC set, all of the other serial section circuitry is irrelevant to the critical activity, and this is indicated "X"s for "don't care". The parallel data PDx lines are programmed with "100" to look for the fifth count:

TABLE 2

|   | P0 | P1 | P2 | PR | PTC | S0 | S1 | S2 | S3 | S4 | S5 | S6 | S7 | BOR | CAT | STC | TC |
|---|----|----|----|----|-----|----|----|----|----|----|----|----|----|-----|-----|-----|-----|
| 1 | 0  | 0  | 0  | 0  | 0   | X  | X  | X  | X  | X  | X  | X  | X  | X   | X   | 1   | 0  |
| 2 | 1  | 0  | 0  | 0  | 0   | X  | X  | X  | X  | X  | X  | X  | X  | X   | X   | 1   | 0  |
| 3 | 0  | 1  | 0  | 0  | 0   | X  | X  | X  | X  | X  | X  | X  | X  | X   | X   | 1   | 0  |
| 4 | 1  | 1  | 0  | 0  | 0   | X  | X  | X  | X  | X  | X  | X  | X  | X   | X   | 1   | 0  |
| 5 | 0  | 0  | 1  | 0  | 1   | X  | X  | X  | X  | X  | X  | X  | X  | X   | X   | 1   | 1  |

The counter of the present invention may be implemented in a variety of ways, only one of which has been described in detail. It will be apparent to those skilled in the art that many changes and modifications can be made without departing from the essence of the invention in its broader aspects. The following claims are therefore intended to cover all such changes and modifications as fall within the true scope and spirit of the invention.

I claim:

1. A synchronous two-stage serial/parallel counter circuit comprising:
   a parallel counter section for counting on system clocks and producing a parallel terminal count output and a frame output;
   a serial counter section for counting on the frame output of the parallel counter section and producing a serial terminal count output, the serial counter section having as many bits in its length as the maximum count capacity of the parallel counter section; and
   means for producing a terminal count signal upon the simultaneous occurrence of the parallel terminal count and the serial terminal count.

2. A synchronous two-stage serial/parallel counter circuit as recited in claim 1 further comprising means for initializing the parallel and serial counter sections.

3. A synchronous two-stage serial/parallel counter circuit as recited in claim 2 wherein the initializing means is a load signal that resets the parallel counter section to a known state and the serial counter section to a precount condition established by the state of a set of serial data signals, and wherein the parallel counter section further comprises programmable means for recognizing a particular count of the parallel counter section to generate the parallel terminal count output, thus making the counter circuit programmable.

4. A synchronous two-stage serial/parallel counter circuit as recited in claim 1 wherein the parallel counter section comprises a linear feedback shift register.

5. A synchronous two-stage serial/parallel counter circuit as recited in claim 1 wherein the serial counter section comprises:
   a shift register coupled in a circular fashion for receiving a programming value and circulating an intermediate data value completely once each full count of the parallel counter section, such full count of the parallel counter section defining a circulation interval;
   means for subtracting disposed to subtract a one from the contents of the shift register each time that the intermediate data value circulates in the shift register and a frame signal has been received from the parallel section during the most recent circulation interval; and
   means for detecting when the shift register contains all zeros and outputting a serial terminal count signal in response to such detection.

6. A synchronous two-stage serial/parallel counter circuit as recited in claim 3 wherein the load signal is the terminal count signal.

* * * * *